March 3, 1959 J. P. ECKERT, JR 2,876,440
PULSE STRETCHING AMPLIFIERS
Filed Dec. 19, 1955 3 Sheets-Sheet 1

INVENTOR.
JOHN PRESPER ECKERT, JR.
BY
Charles E. English
AGENT

PULSE STRETCHING AMPLIFIERS

Filed Dec. 19, 1955 3 Sheets-Sheet 2

*INVENTOR.*
JOHN PRESPER ECKERT, JR.
*BY*
Charles C. English
AGENT

March 3, 1959 J. P. ECKERT, JR 2,876,440

PULSE STRETCHING AMPLIFIERS

Filed Dec. 19, 1955 3 Sheets-Sheet 3

INVENTOR.
JOHN PRESPER ECKERT, JR.
BY
Charles C. English
AGENT

United States Patent Office 2,876,440

Patented Mar. 3, 1959

2,876,440

PULSE STRETCHING AMPLIFIERS

John Presper Eckert, Jr., Philadelphia, Pa., assignor to Sperry Rand Corporation, New York, N. Y., a corporation of Delaware Application December 19, 1955, Serial No. 553,823

19 Claims. (Cl. 340—174)

The present invention relates to pulse type amplifiers for use in computer devices, and is more particularly concerned with an amplifier, as well as with a chain of such amplifiers, which is adapted to provide gain by a pulse stretching of signals within the amplifier.

In the provision of amplifiers for use in various electronic devices, such as those required in various computer applications, a compromise must often be struck between a desired high frequency of operation and the various losses within the structure resulting from increases in such frequency of operation. Thus, relatively high frequencies of input signal often require that input circuits utilizing, for instance, diode gates, comprise relatively high-grade diodes, thereby increasing the cost of the circuit; and in addition, often require that these input circuits draw high average currents whereby the internal losses of the circuit are magnified with a resultant decrease of efficiency of the over-all device. When these losses are sought to be decreased through a decrease in input signal frequency, the permissible repetition rate of the circuit in turn decreases.

The present invention serves to obviate this known difficulty in pulse type amplifiers, and is particularly directed toward an amplifier of novel construction which is adapted to accept relatively low frequencies of input signals and to respond to such low frequency inputs by providing high frequency outputs. By this structure, therefore, individual amplifiers and computer circuits utilizing such amplifiers, may be operated at higher repetition rates than has been the case heretofore; and such higher repetition rates are not accompanied by a resulting increase in circuit losses.

In providing for this desired operation, the present invention is particularly directed toward novel amplifier circuits comprising a pair of amplifier stages operating sequentially; and more generically, the circuits of the present invention may be considered to comprise an amplifier stage adapted to give a pulse type output in combination with a further device exhibiting delay or memory and adapted to give a still further pulse type output occurring later in time, thereby to stretch the total output achieved by the combination. In this respect, therefore, the amplifiers of the present invention are characterized by a two-time system of operation wherein signal inputs of relatively low frequency cause operation of an amplifier stage at relatively high frequencies, and these relatively high frequency outputs from the stage, in turn produce a further relatively low frequency output, thereby to permit chains of such amplifiers, or logical circuits comprising such amplifiers, to be constructed.

In a preferred form of the invention, the aforementioned sequentially operated amplifiers may comprise a transistor and a magnetic amplifier respectively; and this novel combination of sequentially operated transistor and magnetic amplifier produces the aforementioned higher speeds of operation with reduced losses, in a manner which is considerably more efficient than has been the case in the past. As will be described subsequently, this more efficient operation, as well as the shift between time systems in the aforementioned two-time system of operation, is achieved in the present invention through the provision of means adapted to accumulate or initially store an input signal; and these input storage means may comprise a capacitor, or when the transistor embodiment of the invention is employed, may comprise enhancement current effected by the storage of minority carriers within the lattice structure of the transistor itself.

It is accordingly an object of the present invention to provide an improved amplifier structure.

A further object of the present invention resides in the provision of improved pulse type amplifiers comprising a pair of sequentially operated amplifier stages.

Another object of the present invention resides in the provision of a pulse type amplifier adapted to respond to relatively low frequency input signals and to give relatively high frequency signal outputs.

Still another object of the present invention resides in the provision of an improved pulse type amplifier for use in computer circuits.

Another object of the present invention resides in the provision of improved pulse type amplifiers adapted to operate at higher repetition rates with lower internal losses than has been the case in the past.

A still further object of the present invention resides in the provision of an improved amplifier structure operating on a two-time system wherein a long relatively low frequency input signal is adapted to produce short relatively high frequency internal signals within the amplifier, and these short relatively high frequency internal signals are in turn adapted to produce a further long relatively low frequency output signal.

Another object of the present invention resides in the provision of an improved sequentially operated amplifier comprising a transistor stage and a magnetic amplifier stage.

A still further object of the present invention resides in the provision of improved pulse type amplifiers and complementers having better operating characteristics than has been the case heretofore.

In providing for the foregoing objects, preferred embodiments of the present invention comprise a transistor and a magnetic amplifier adapted to operate sequentially. Signal inputs of relatively low frequency are caused to be stored or accumulated during an initial time period, and this accumulation may be effected in an input capacitor or by enhancement effects in the transistor. The signal so stored at the input is then caused to provide a pulse type input to the aforementioned transistor through the control of an appropriate pulse source, whereby the said transistor produces a short relatively high frequency pulse output. This transistor output, in accordance with certain embodiments of the present invention, is coupled to a memory or delay device which preferably takes the form of a magnetic amplifier generally of the type described by Steagall in his Patent No. 2,710,952, issued June 14, 1955, for: "Ring Counter Utilizing Magnetic Amplifiers." This magnetic amplifier in turn produces a further pulse output of short duration and high frequency. The high frequency outputs thus produced by the transistor and magnetic amplifier sections of my invention may be directly utilized for the control of other circuits, for instance within a computer structure; and these outputs may further be buffed together, thereby to provide an effectively stretched output and a shift back to the long low frequency signal described previously, whereby plural stages, of the types to be described, may be interconnected to form various logical devices.

The foregoing objects, advantages, construction and operation of the present invention will become more readily apparent from the following description and accompanying drawings, in which.

Figure 1A:
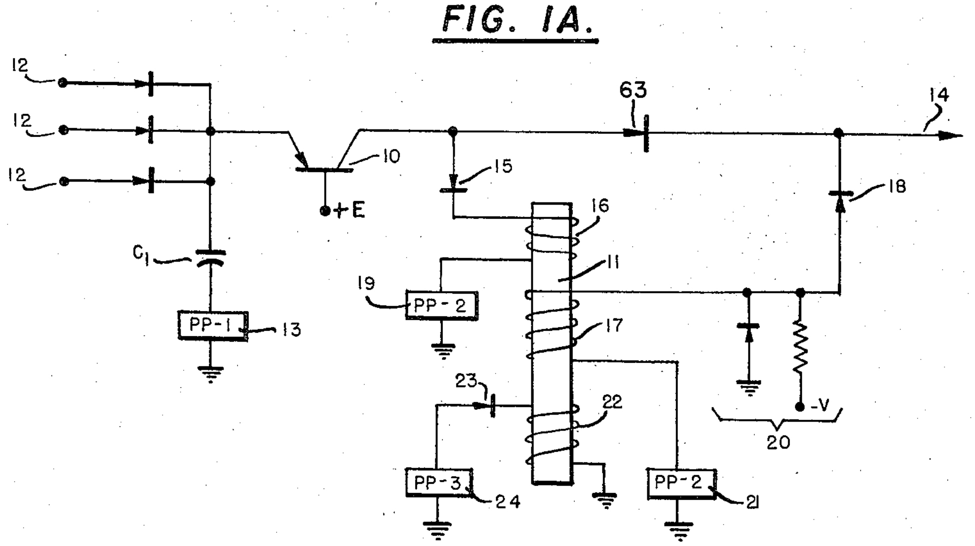
Figure 1A is a schematic diagram of a preferred form of sequentially operated transistor and magnetic amplifier constructed in accordance with the present invention.

Referring now to Figure 1, it will be seen that in accordance with the present invention an improved amplifier circuit may comprise a pair of amplifying elements adapted to operate sequentially. In the particular embodiment illustrated, these two amplifying elements comprise a transistor 10 and a magnetic amplifier 11. Input signals may appear at any one of the buffed input terminals 12, and these input signals, which are of relatively low frequency, are caused to be accumulated in a capacitor C1 during an initial time period. Subsequent to this initial time period, a pulse source 13, having a "phase 1" (PP–1, see Figure 2A), is caused to discharge capacitor C1 into the transistor 10 whereby transistor 10 produces an output pulse of short duration at its collector.

This output pulse from transistor 10 is coupled via a rectifier 63, to an ultimate output terminal 14, and is also coupled via a rectifier 15 to an input winding 16 carried by magnetic amplifier 11; and this input signal to amplifier 11 in turn produces an output from the said amplifier 11 across an output winding 17 carried by the said amplifier. The output from amplifier 11 is also coupled to the ultimate output terminal 14 via a further rectifier 18 whereby the sequential pulses appearing in successive time intervals from the outputs of transistor 10 and magnetic amplifier 11 are buffed together at ultimate output terminal 14 thereby to produce an ultimate output of relatively low frequency. This ultimate output may, if desired, be coupled to an input terminal analogous to 12 in a further like amplifier stage.

As mentioned previously, the magnetic amplifier 11 may be generally of the type described in Steagall Patent No. 2,710,952; and such an amplifier may comprise a core of magnetic material, preferably but not necessarily exhibiting a substantially rectangular hysteresis loop. The input winding 16, as has been described, is coupled at one of its ends to the output of transistor 10 via rectifier 15; and the other end of the said input winding 16 is coupled to a pulse source 19 having a "phase 2" (PP–2, see Figure 2B), which acts essentially as a blocking source. The output winding 17 of the amplifier 11 is coupled at one of its ends via rectifier 18 to ultimate output point 14, and this end of the output winding 17 may include a sneak suppressor or clamp circuit 20, again of the type described in the aforementioned Steagall patent. The other end of output winding 17 is coupled to a further energizing pulse source 21, again having a phase 2 (see Figure 2B).

The amplifier 11 is generically of the type known as a non-complementing pulse type amplifier, and reversion may be effected by a circuit of the type shown in the aforementioned Steagall patent. In the alternative, however, such reversion may be effected in the manner illustrated in Figure 1A, by means comprising a reverting winding 22 grounded at one of its ends and coupled at the other of its ends via a rectifier 23 to the reverting pulse source 24 having a "phase 3" (PP–3, Figure 2C).

Figure 2:
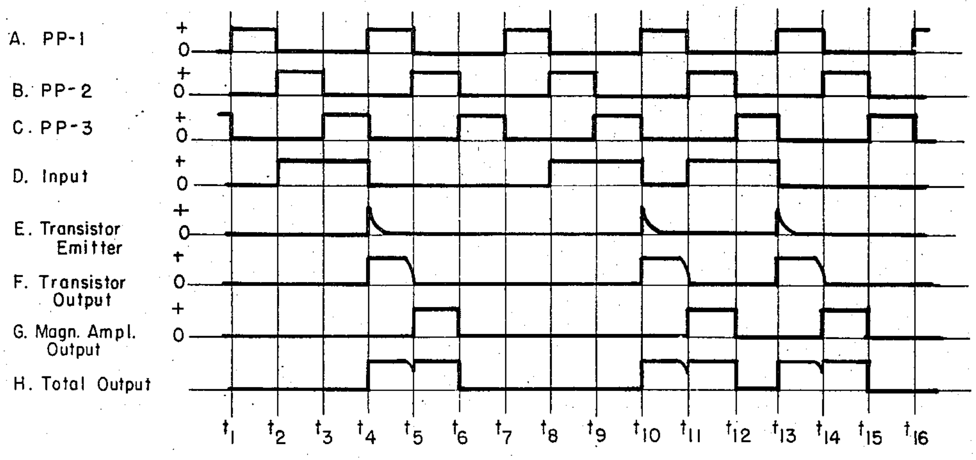
Figure 2 (A through H) are waveform diagrams illustrating the operation of the circuits shown in Figures 1A and 1B.

The operation of the over-all device shown in Figure 1A will become more readily apparent from a consideration of the waveforms illustrated in Figure 2. Thus, during a first time period *t1* to *t2*, the pulse source 13 having phase 1 is at a positive potential, thereby assuring that capacitor C1 is cleared of all charge. At time *t2* the pulse source 13 falls to substantially ground potential and remains at this ground potential for the time interval *t2* to *t4*, corresponding to an input time period. If now an input signal should appear at one of the terminals 12 during this time interval *t2* to *t4* (Figure 2D), the input signal will be coupled to capacitor C1 and will charge the said capacitor C1 accordingly. During this charging of the capacitor C1, time interval *t2* to *t4*, pulse source 19 is initially positive during the time interval *t2* to *t3* thereby preventing any input to the amplifier 11; and pulse source 24 is positive during the time interval *t3* to *t4* thereby to revert the core of magnetic amplifier 11, for instance to its minus remanence operating point, if the said core of amplifier 11 had been at some other operating point due to prior operating conditions in the circuit.

At time *t4*, source 12 rises to a positive potential (Figure 2A) thereby releasing the charge in capacitor C1 to the emitter of transistor 10; and this release of charge is characterized by a short high pulse applied to the said emitter of transistor 10 (Figure 2E). The transistor 10 is accordingly driven into heavy conduction and this conduction continues during the time period *t4* to *t5* (Figure 2F), due to enhancement effects within the transistor itself. The pulse type output so produced by transistor 10 is coupled via rectifier 63 to terminal 14 and is also coupled via rectifier 15 to one end of input winding 16 during the time interval *t4* to *t5*.

During this particular time interval *t4* to *t5*, the blocking source 19, having a phase 2 operation (Figure 2B), is at substantially ground potential whereby current flows through the said input winding 16 causing the core of amplifier 11 to be moved from its minus remanence operating point substantially to its plus remanence operating point. During a next subsequent time interval *t5* to *t6*, the energization pulse source 21 goes positive (Figure 2B), thereby driving the core of amplifier 11 to positive saturation; and an appreciable pulse of output current thus flows from the source 21 via winding 17 and thence via rectifier 18 to the ultimate output point 14 of the system (Figure 2G). Thus, output point 14 is provided with two successive output pulses appearing respectively during the time interval *t4* to *t5* and *t5* to *t6* (Figure 2H), whereby the ultimate output from the system is again a pulse of relatively low frequency having in fact the same width as the input pulse initially applied to the system (Figure 2D). During a next subsequent time period *t6* to *t7*, the power pulse source 24 (Figure 2C) goes positive thereby passing a reverting current via rectifier 23 and reverting winding 22; and the core of magnetic amplifier 11 is reverted to its minus remanence operating point preparatory to reception of further input signals to the system.

A still further operating sequence is illustrated in Figure 2, during the time intervals *t8* to *t15*, and this further operating sequence illustrates the functioning of the system in response to the application of two successive input pulses. It will be noted that in the operation of the system thus described, the input and output pulses are of equal time duration, while the conducting periods for the transistor and for the magnetic amplifier comprising that system are of approximately half the duration of the input and output pulses. The change in timing is accomplished by the accumulation of charge in the capacitor C1 during the long input cycle and by the then abrupt discharge of that capacitor C1 into the transistor 10 whereby the operation described is effected.

It should also be noted that in the particular timing sequence illustrated in Figure 2 some overlap of input and output time period results. This may be seen most readily from the operation of the system, for instance during the time interval *t*10 to *t*13; and it will be appreciated that for the timing selected, an output pulse portion may occur during the time interval *t*11 to *t*12 in response to an input signal during the time interval *t*8 to *t*9, and that this output time interval *t*11 to *t*12 overlaps an input time interval comprising a portion of the total input time period *t*11 to *t*13. Such an overlap of input and output time periods may complicate the clock pulse requirements of an over-all circuit such as that of a digital computer; and in order to simplify these clock pulse requirements, an additional time period may be inserted so as to provide an equal time of "on" and "off" for both the input and output circuits. Such an additional time period will be described subsequently, particularly in reference to Figure 4.

It should further be noted that inasmuch as the signal pulses appearing at terminal 12 are of long duration and consequently represent lower frequencies than that of the short pulses operating within the amplifier structure, the interconnecting diodes or gates which may be utilized when plural structures of the type shown in Figure 1A are to be effected, operate at lower frequencies and at lower average currents than has been the case in the past. As a result, diode losses are reduced substantially and lower grade diodes can in fact be utilized in the structure without detracting from the efficiency of operation. For high frequency applications, the combination of sequentially operated transistor and magnetic amplifier described in reference to Figure 1A, also allows computer circuits to be designed which operate faster than those presently available.

In the system described in reference to Figure 1A, a shift in timing between the two-time system described has been effected by the initial storage of a long relatively low frequency input signal, and this storage has been effected by an input capacitor. As has further been described in reference to Figure 1A, the stored charge, when ultimately released to the transistor input, causes enhancement and a stretching of output within the transistor itself. This enhancement phenomenon, which has in fact previously been considered undesirable, may be utilized to advantage in providing the aforementioned initial charge storage whereby the input capacitor illustrated in Figure 1A may be eliminated.

Figure 1B:
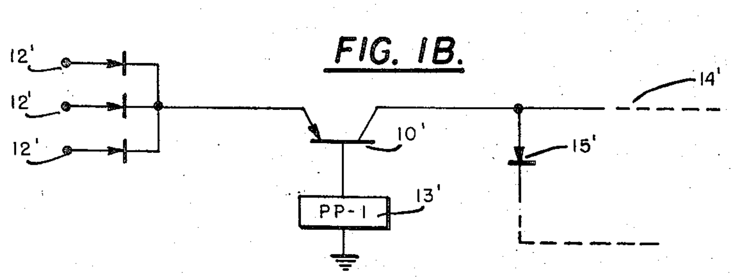
Figure 1B is a partial schematic diagram of a modified form of circuit adapted to be utilized in the combination of Figure 1A.

Thus, referring to Figure 1B, it will be seen that inputs appearing at the terminals 12′ may be coupled to the emitter of a transistor 10′; and the base of the said transistor 10′ rather than being coupled to a fixed reference source +E, as was the case in Figure 1A, may be coupled to a control pulse source 13′, again having the pulse configuration shown in Figure 2A. With such an arrangement, therefore, input signals coupled to the emitter of transistor 10′ during a time interval when the pulse source 13′ is at substantially ground potential, injects minority carriers into the lattice structure of the solid state material comprising transistor 10′; and when the pulse source 13′ thereafter rises to its positive potential, appreciable enhancement current flows in the collector circuit of the transistor whereby a pulse type output is coupled to ultimate output terminal 14′ and is also coupled via rectifier 15′ to a storage device such as the non-complementing type magnetic amplifier described previously. It will be appreciated that the circuit shown in Figure 1B is only a partial schematic, and that the remainder of the circuit may take the form already described in reference to Figure 1A.

Figure 3:
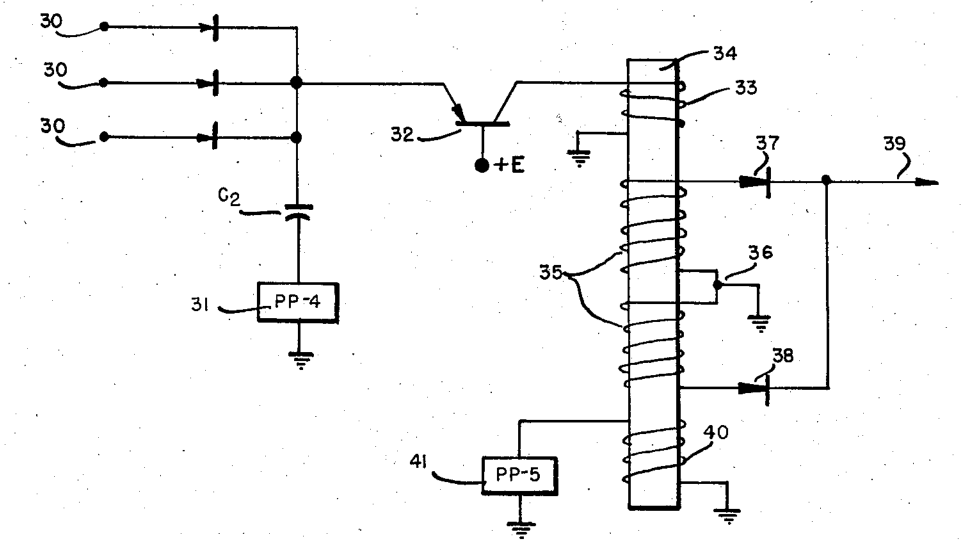
Figure 3 is a schematic diagram of a further embodiment of the present invention, again comprising the combination of a transistor and a magnetic amplifier.

A still further modification of the present invention is shown in Figure 3, and this particular embodiment again utilizes a combination of transistor and magnetic amplifier, but operates to provide the desired pulse stretched output through the provision of a push-pull winding on the amplifier itself rather than by the coupling of the transistor output to an ultimate output terminal. Thus, referring to Figure 3, it will be seen that input signals may, as before, occur on one or more of the input terminals 30; and these input signals which are of relatively low frequency, may, as has been described, be initially stored in a capacitor C2 under the control of a pulse source 31 (Figure 4A). Charges so stored in capacitor C2 are selectively coupled to the emitter of transistor 32 whereby output pulses selectively appear at the collector of the said transistor 32 and are coupled to an input winding 33 of the magnetic amplifier 34. Amplifier 34 comprises an output winding 35 center-tapped to ground at 36; and the opposing ends of the said output winding 35 are coupled via rectifiers 37 and 38 to an ultimate output point 39. A reverting winding 40 is also provided, and one end of the said reverting winding is coupled to a reverting pulse source 41 (Figure 4B).

In accomplishing the general operation of the circuit thus shown in Figure 3, let us assume that the core comprising amplifier 34 is initially at its minus remanence operating point. In the absence of an input signal to input winding 33, each reverting pulse from source 41 will drive the said core comprising amplifier 34 from its minus remanence operating point into negative saturation; and for such operation there will be relatively little flux change in the amplifier core whereby substantially no output will be induced in the output windings 35. Small outputs which may in fact be induced in the said amplifier 35 during this saturated condition of operation, may be eliminated by an appropriate sneak suppressor or clamp circuit coupled to terminal 39. Upon application of an input pulse to winding 33, however, the core of amplifier 34 is driven from its minus remanence to its plus remanence operating point thereby effecting an appreciable flux change in the amplifier core whereby a substantial potential is induced across windings 35. The full-wave rectification system provided by grounded center-tap 36 and rectifiers 37 and 38 thus permits an output pulse to appear at terminal 39. During a next subsequent time period, the reverting pulse source 41 drives the core from its plus remanence operating point back to its minus remanence operating point, inducing a still further potential in output winding 35, this time of opposite polarity to that previously induced in response to the input signal; and this further output pulse is again coupled by full-wave rectifiers 37 and 38 to output point 39.

Figure 4:
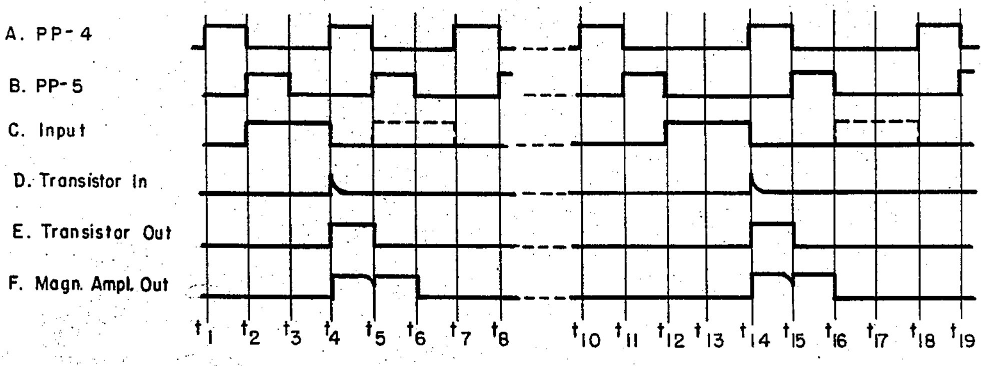
Figure 4 (A through F) are waveform diagrams illustrating the operation of the circuit shown in Figure 3.

The aforementioned operation will become more readily apparent from a consideration of the waveforms shown in Figure 4. Thus, during an initial time period *t*1 to *t*2, the pulse source 31 is positive in potential (Figure 4A), thereby clearing capacitor C2 of any charge therein. During an input time period *t*2 to *t*4, an input signal may be coupled to one or more of the terminals 30, thereby charging capacitor C2; and at time *t*4, pulse source 31 rises to a positive potential thereby to provide a short high input signal to the emitter of transistor 32 (Figure 4D). Transistor 32 thus effects a pulse type output signal in its collector circuit during the time interval *t*4 to *t*5; and this output from transistor 32 acts as an input to the amplifier 34 passing current through winding 33 and driving the core of amplifier 34 from its minus to its plus remanence operating point, in the manner already described.

Thus, during time interval *t*4 to *t*5, the core of amplifier 34 is set from its minus remanence to its plus remanence operating point, effecting a relatively large flux change through the core and producing a first output pulse at terminal 39 (Figure 4F). During a next subsequent time period t5 to t6, the reverting pulse source 41 rises to a positive potential (Figure 4B), whereby reverting current flows through winding 40, and the core of amplifier 34 is reset from its plus remanence to its minus remanence operating point thereby to produce a further output pulse at terminal 39 (Figure 4F). Thus, in the absence of a signal input to the amplifier 34, no output appears at terminal 39, while in response to such a signal input, an output does appear. As before, it will be noted that the input and output signals are of substantially equal widths, but that the transistor employed is required to conduct for only half of the input or output pulse duration.

As has been mentioned previously, an overlap of input and output time periods may result when the timing illustrated in Figure 4 for the time interval t1 to t8 is selected; and this has been illustrated in Figure 4 by the dotted representation in Figure 4C, during the time interval t5 to t7, which represents a next subsequent input pulse period. As was mentioned in reference to Figure 2, and as will be seen by comparison of Figures 4C and 4F for the total time interval t4 to t7, some overlap of input and output pulse periods may result. This overlap may be eliminated by inserting an extra time period in the operation of the system, and such an alternative timing has been illustrated in Figure 4, for the total time interval t10 to t19. The operation of the circuit is identical with that already described for this latter time interval; except that the output pulse period, for instance t14 to t16, is distinct from the input pulse periods, such as t12 to t14, and t16 to t18.

The circuit arrangements thus far described are essentially non-complementing amplifiers, in that the stages do not produce an output in the absence of an input signal; or, in the alternative, an output is produced only in response to an input signal. In many forms of computer devices, or in other forms of electronic structures, it is often required to provide complementing amplifiers wherein an output is produced in the absence of an input; or in the alternative, the presence of an input inhibits an output. Such an alternative arrangement, constructed in accordance with the present invention, is illustrated in Figure 5; and the circuit thus provided is quite similar to that already described in reference to Figure 1A, except for alterations in the transistor connections and in one of the pulse sources employed.

Figure 5:
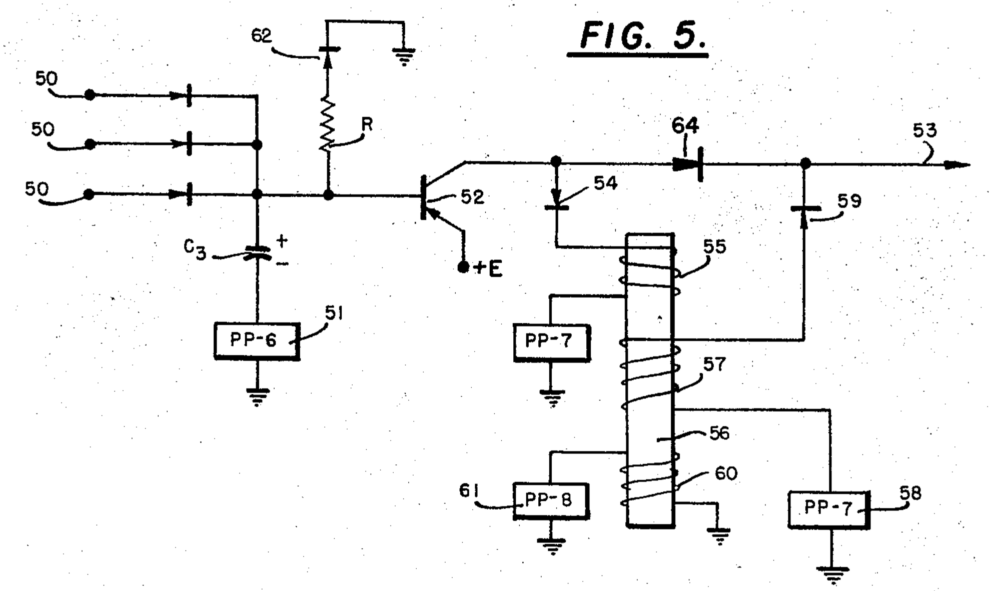
Figure 5 is a schematic diagram of a sequentially operated transistor and magnetic amplifier adapted to operate as a complementer of input signals.

Thus, referring to Figure 5, it will be seen that input signals of relatively low frequency may be applied to one or more of the input terminals 50; and these input signals, may, as before, be coupled to an input capacitor C3 under the control of a pulse source 51 (Figure 6A). The capacitor C3 is coupled to the base of a transistor 52, the emitter of which is connected to a fixed reference source +E; and the collector of transistor 52 is coupled via a rectifier 64 to an ultimate output point 53, and is also coupled via a rectifier 54 to the input winding 55 of a magnetic amplifier 56. The amplifier 56, as has been described in reference to Figure 1A, includes an output winding 57 coupled at one of its ends to an energization pulse source 58 (Figure 6B); and coupled at the other of its ends via a rectifier 59 to the said ultimate output point 53. Amplifier 56 also includes a reverting winding 60, coupled to a reverting pulse source 61 (Figure 6C).

The operation of the magnetic amplifier portion of the circuit, comprising elements 54 through 61 inclusive, has already been described in reference to Figure 1A; and this operation is again such that an output pulse is coupled via rectifier 59 to the ultimate output point 53 only in response to an input pulse appearing from the output of transistor 52 via rectifier 54. The over-all operation of the circuit differs from that of Figure 1A, however, due to the change in connection of transistor 52, and due in addition to a change in pulse configuration for the source 51 (Figure 6A), as compared with the source 13 (Figure 2A). These latter changes are such that in the absence of input signals at one or more of terminals 50, the transistor 52 produces regularly occurring pulse outputs; and these regular pulse outputs from transistor 52 are, as before, coupled to ultimate output terminal 53 and are also coupled via rectifier 54 to cause amplifier 56 to produce further pulse outputs at terminal 53 during successive time periods. A signal input to one or more of terminals 50 acts to inhibit an output from transistor 52, whereby no pulse appears from the said transistor 52 at output terminal 53 and no input is supplied to magnetic amplifier 56.

In accomplishing this modified operation, the pulse source 51 normally exhibits a positive output potential, and regularly falls to substantially ground potential. In the absence of signal inputs at one or more of terminals 50, this regular fall of pulse source 51 to ground pulls the base of transistor 52 to substantially ground potential whereby the transistor 52 produces regular output pulses. The application of an input pulse at one or more of terminals 50, however, charges capacitor C3, and upon discharge of the said capacitor C3, a current flows via the circuit comprising resistor R and rectifier 62, thereby to maintain the base of transistor 52 at a positive potential whereby the said transistor produces no output.

Figure 6:
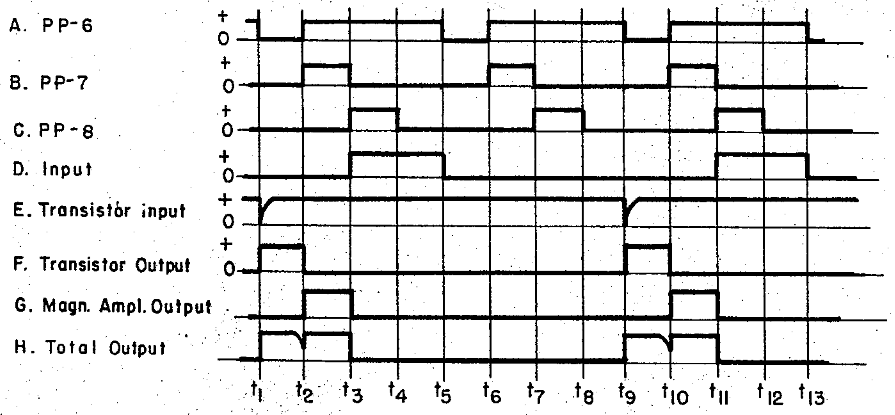
Figure 6 (A through H) are waveform diagrams illustrating the operation of the circuit shown in Figure 5.

This operation will be more readily apparent from an examination of the waveforms shown in Figure 6. If we should initially assume that capacitor C3 has no charge (i. e. no input pulse was applied to terminals 50 during preceding time periods), the fall of pulse source 51 to substantially ground potential, for instance at the time t1, will pull the base of transistor 52 to substantially ground potential whereby the said transistor produces an output pulse during the time interval t1 to t2 (Figure 6F). This output pulse from the transistor 52 is, as has been discussed previously, coupled via rectifier 54 to the input winding 55 of amplifier 56. Thus, under the control of pulse sources 58 and 61, the said amplifier 56 produces an output pulse during the time interval t2 to t3 (Figure 6G) and the said amplifier is then reverted to its minus remanence operating point preparatory to reception of a further input pulse via rectifier 54.

If an input signal should appear at one or more of terminals 50, during the time interval t3 to t5, the capacitor C3 will be charged with the polarity indicated in Figure 5, and at time t5, when pulse source 51 falls to its ground potential, the charge in capacitor C3 will flow via resistor R and rectifier 62 to ground, thereby holding the base of transistor 52 at a positive potential. Transistor 52 thus produces no output pulse during the time interval t5 to t6 (Figure 6F), notwithstanding the fall of pulse source 51 to substantially ground potential (Figure 6A) during this time interval; and this lack of an output pulse from transistor 52 assures that no input pulse is applied to amplifier 56 via rectifier 54. Thus, in response to the input pulse appearing during the time interval t3 to t5 (Figure 6D), no output pulse appears at terminal 53 during the time interval t5 to t7 (Figure 6H), whereby the system acts as a complementer. A further sequence of operation is illustrated in Figure 6 for the time interval t9 to t13.

While I have described preferred embodiments of the present invention, many variations will be suggested to those skilled in the art. It must, therefore, be understood that the foregoing description is meant to be illustrative only and should not be considered limitative of my invention; and all such variations as are in accord with the principles described are meant to fall within the scope of the appended claims.

Having thus described my invention, I claim:

1. In an amplifier, a transistor, means for accumulating a relatively wide input signal, means for coupling said accumulated input signal to said transistor whereby said transistor selectively produces a pulse output of a duration shorter than said input signal, and means responsive to the pulse output of said transistor for producing a stretched pulse output of substantially the same duration as that of said input signal.

2. The combination of claim 1 wherein said accumulating means comprises a storage capacitor.

3. The combination of claim 1 wherein said last named means comprises delay means for producing a further pulse output during a time interval subsequent to occurrence of a pulse output from said transistor, and means coupling the sequential outputs of said transistor and of said delay means to a common output point.

4. The combination of claim 3 wherein said delay means comprises a pulse type magnetic amplifier.

5. The combination of claim 1 wherein said last named means comprises a magnetic amplifier having a core of magnetic material capable of assuming stable remanence conditions, said core being driven from a first hysteretic operating point to a second hysteretic operating point in response to the pulse output from said transistor, pulse means for moving said core from said second operating point to a different operating point, and winding means on said core for producing an output during excursions of said core between said second operating point and said different operating point.

6. The combination of claim 5 including a full-wave rectifier between said winding means and an output point, said pulse means comprising means reverting said core from said second to said first operating point, whereby pulses appear at said output point during each excursion of said core between said first and second hysteretic operating points.

7. The combination of claim 5 wherein said magnetic amplifier produces an output only during operation of said core between said second and said different operating points, and means coupling the outputs of said transistor and of said magnetic amplifier to a common output point.

8. In an amplifier, a source of input signals, a transistor, means for accumulating a signal from said source during a first time interval, means operative during a second time interval subsequent to said first time interval for changing the output state of conductivity of said transistor in response to said accumulated input signal, and memory means operative during a third time interval subsequent to said second time interval for stretching output pulses produced by said transistor.

9. The amplifier of claim 8 wherein said second time interval is shorter than said first time interval.

10. The amplifier of claim 9 wherein said third time interval is of substantially the same length as said first time interval.

11. The amplifier of claim 8 wherein said means accumulating said input signal comprises means coupling said input signal to said transistor thereby to enhance said transistor, said means operative during said second time interval comprising a pulse source coupled to said transistor for effecting enhancement current flow in the output of said transistor.

12. The amplifier of claim 8 wherein said means accumulating said input signal comprises a capacitor coupled to said source of input signals, said means operative during said second time interval comprising a pulse source for discharging said capacitor to the input of said transistor.

13. The amplifier of claim 8 wherein said memory means operative during said third time interval comprises a pulse type non-complementing magnetic amplifier, said amplifier comprising a core of magnetic material capable of assuming stable remanence conditions.

14. The amplifier of claim 13 wherein the outputs of said magnetic amplifier and of said transistor occur sequentially with respect to one another, and means coupling said sequential outputs to a common output point.

15. The amplifier of claim 8 wherein said transistor is normally conductive during said second time interval, said transistor being rendered non-conductive in response to said accumulated input signal, whereby said amplifier operates as a complementer of said input signals.

16. In an amplifier, a transistor, storage means, input means for selectively coupling an input signal to said storage means, control means operative subsequent to operation of said input means for coupling a signal from said storage means to the input of said transistor thereby to control the output state of said transistor, a pulse type magnetic amplifier comprising a core of magnetic material capable of assuming stable remanence conditions, means coupling the output of said transistor to the input of said magnetic amplifier, said magnetic amplifier including means responsive to the output state of said transistor and operative subsequent to operation of said control means for controlling the output state of said magnetic amplifier, and means coupling the output of said transistor and the output of said magnetic amplifier to a common output point.

17. The combination of claim 16 wherein said storage means comprises a storage capacitor, said control means comprising a source of regularly occurring pulses coupled to said capacitor for regularly discharging said capacitor.

18. In an amplifier, a transistor, input means selectively coupling an input signal to said transistor, a magnetic amplifier comprising a core of magnetic material capable of assuming stable remanence conditions, means coupling the output of said transistor to the input of said magnetic amplifier, and means coupling the output of said transistor and the output of said magnetic amplifier to a common output point, said transistor being rendered non-conductive in response to an input signal applied thereto whereby said combination operates as a complementing amplifier.

19. The combination of claim 16 wherein said transistor is rendered conductive in response to a signal applied thereto from said storage means whereby said combination operates as a non-complementing amplifier.

References Cited in the file of this patent

UNITED STATES PATENTS

| | | |
|---|---|---|
| 2,710,928 | Whitney | June 14, 1955 |
| 2,729,754 | Steagall | Jan. 3, 1956 |
| 2,730,576 | Caruthers | Jan. 10, 1956 |
| 2,748,296 | Lipkin | May 29, 1956 |
| 2,760,088 | Pittman | Aug. 21, 1956 |